United States Patent [19]
Herrmann et al.

[11] Patent Number: 4,842,988
[45] Date of Patent: Jun. 27, 1989

[54] PRESENSITIZED WATERLESS PLANOGRAPHIC PRINTING PLATE WITH AMORPHOUS SILICIC ACID INTERLAYER AND PROCESS OF MAKING AND USING

[75] Inventors: Heinz Herrmann; Hans-Joachim Schlosser, both of Wiesbaden, Fed. Rep. of Germany

[73] Assignee: Hoechst Aktiengesellschaft, Frankfurt am Main, Fed. Rep. of Germany

[21] Appl. No.: 87,677

[22] Filed: Aug. 20, 1987

[30] Foreign Application Priority Data

Aug. 23, 1986 [DE] Fed. Rep. of Germany ....... 3628719

[51] Int. Cl.$^4$ .......................... G03C 1/54; G03C 1/68; G03C 1/71; G03F 7/08
[52] U.S. Cl. ......................................... 430/14; 430/17; 430/18; 430/162; 430/166; 430/169; 430/271; 430/272; 430/303
[58] Field of Search ............... 430/166, 162, 169, 271, 430/272, 303, 14, 17, 18

[56] References Cited

U.S. PATENT DOCUMENTS

| | | | |
|---|---|---|---|
| 2,714,066 | 7/1955 | Jewett et al. | 430/302 |
| 3,181,461 | 5/1965 | Fromson | 430/278 |
| 3,511,178 | 5/1970 | Curtin | 101/450 |
| 4,054,094 | 10/1977 | Caddell et al. | 430/302 |
| 4,326,020 | 4/1982 | Golda et al. | 430/155 |
| 4,342,820 | 8/1982 | Kinashi et al. | 430/11 |
| 4,347,303 | 8/1982 | Asano et al. | 430/303 |
| 4,358,522 | 11/1982 | Fujita et al. | 430/166 |
| 4,376,814 | 3/1983 | Walls | 430/159 |

FOREIGN PATENT DOCUMENTS

| | | |
|---|---|---|
| 0100938 | 2/1984 | European Pat. Off. . |
| 0154980 | 9/1985 | European Pat. Off. . |
| 1442374 | 7/1976 | United Kingdom . |
| 1444381 | 7/1976 | United Kingdom . |

OTHER PUBLICATIONS

"Chemical Abstracts", vol. 100, No. 20, May 14, 1984, p. 568.
"Chemical Abstracts", Radiation Chem., Photochem, vol. 93, Dec. 1980, No. 12, p. 543.

Primary Examiner—Charles L. Bowers, Jr.
Attorney, Agent, or Firm—Foley & Lardner, Schwartz, Jeffery, Schwaab, Mack, Blumenthal & Evans

[57] ABSTRACT

A presensitized printing plate suitable for waterless planographic printing is disclosed, which comprises a layer support, a radiation-sensitive layer, an outer, ink-repellent, cross-linked silicone elastomer layer, and an intermediate layer of amorphous silicic acid, by which the adhesion of the silicone elastomer layer to the radiation-sensitive layer is improved. The adhesive layer is physiologically safe and effects a good anchoring of the silicone elastomer layer. The process of making and using the presensitized printing plate are also disclosed.

24 Claims, No Drawings

PRESENSITIZED WATERLESS PLANOGRAPHIC PRINTING PLATE WITH AMORPHOUS SILICIC ACID INTERLAYER AND PROCESS OF MAKING AND USING

BACKGROUND OF THE INVENTION

The present invention relates to a presensitized printing plate for waterless planographic printing, in particular offset printing, and to a process for preparing a printing form by exposure and development of said printing plate. The printing plate of this invention comprises a layer support, a radiation-sensitive layer and an outer, ink-repellent layer of silicone rubber.

Printing plates as described above and comprising positive-working or negative-working radiation-sensitive, in particular photosensitive, layers have, for example, been disclosed by U.S. Pat. No. 3,511,178. Diazonium salt condensation products are employed as negative-working, i.e., photocurable photosensitive compounds. The exposed printing plate is developed by means of a solution in which the unexposed portions of the -photosensitive layer are dissolved and the silicone rubber layer is swollen. The silicone rubber portions on top of the soluble layer portions can be removed by rubbing. The printing form obtained is ink-receptive in the bared areas of the layer support, whereas the silicone rubber layer still present in the non-exposed areas of the layer support is ink-repellent. Thus, the printing form prints a negative image of the transparency employed for exposure Insoluble precipitation products of diazonium salts and phosphotungstic acid are used as positive-working photosensitive compounds. In this case, an intermediate layer comprising a diazonium salt/formaldehyde condensate is provided between the photosensitive layer and the silicone rubber layer, in order to anchor the latter to the photosensitive layer. This intermediate layer is crosslinked by heat when the silicone elastomer layer is cured into the silicone rubber layer and then effects the desired improved adhesion.

There are also known planographic printing plates suitable for waterless printing, wherein other layers which are rendered soluble by exposure are used. Practically all of these plates require an appropriate adhesive layer.

According to German Offenlegungsschrift No. 29 43 379 (U.S. Pat. No. 4,358,522), a photosensitive layer of an o-quinonediazide and a novolak is coated with an intermediate layer of an adhesion-promoting aminoalkyl-alkoxysilane.

German Offenlegungsschrift No. 30 45 979 (U.S. Pat. No. 4,342,820) describes a combination of a particular o-quinonediazide layer and a silicone rubber layer. To improve the adhesion between these layers, silicones or silanes can be added to either one of these layers, or an adhesive layer comprising compounds of this type can be applied between the two layers.

European Patent Application No. 100,938 describes a process for improving the adhesion of corresponding layers by a short, slight overall exposure and treatment with a base, for example, a primary amine. An intermediate layer of aminosilanes and/or organotitanates may additionally be applied.

European Patent Application No. 154,980 describes a similar, presensitized printing plate wherein the photosensitive o-quinonediazide layer additionally comprises a coupling component which in a basic medium, such as that used for development, undergoes a coupling reaction with the non-decomposed diazo compound in the unexposed areas, whereby a relatively insoluble azo dye is formed. At the same time, the silicone layer is more firmly anchored to the quinonediazide layer during the coupling reaction. Additionally, an adhesive layer, for example, of aminosilanes or organotitanium compounds, may be present between the aforementioned layers.

German Offenlegungschrift No. 23 50 211 (British Patent No. 1,442,374) describes, inter alia, a printing plate having a photocrosslinkable layer, a silicone adhesive layer and an ink-repellent silicone rubber layer.

German Offenlegungsschriften No. 23 57 871 (British Patent No. 1,444,381) and No. 23 59 102 describe printing plates for waterless offset printing in which an excess of silane is added to a one-component silicone elastomer layer to improve its adhesion to a photopolymer layer or diazonium salt polycondensate layer.

The references show that adhesive layers or adhesion-promoting additives are used in positive- and negative-working photosensitive layers, in combination with silicone elastomer layers. They are particularly necessary when positive-working layers, i.e., layers which are rendered soluble by exposure, are employed, since in these cases no additional anchoring of the image areas of the layer, as a result of photocuring or photocrosslinking, takes place.

Low molecular-weight organic silicon compounds, in particular silanes, are preferably used as adhesion-promoting compounds. The vapors of these compounds are injurious to health and therefore have to be disposed of carefully during the plate manufacture. However, in many instances, the adhesion cannot be sufficiently improved by the addition of these compounds. This is particularly true of the adhesion to layers which are rendered soluble by exposure.

The simultaneously filed Application Ser. No. 087,619, filed Aug. 20, 1987 (German Application No. P 36 28 720.2) assigned to the assignee of the present invention and incorporated herein by reference relates to a presensitized printing plate for waterless planographic printing, which comprises a layer support, a radiation-sensitive layer rendered soluble by exposure, an outer, ink-repellent, crosslinked silicone elastomer layer and an intermediate layer by which the adhesion of the silicone elastomer layer to the radiation-sensitive layer is improved. The radiation-sensitive layer comprises, as the essential constituents:

(a) a compound possessing at least one C—O—C bond which can be split by acid, (b) a compound forming a strong acid upon irradiation, and (c) a water-insoluble binder.

The intermediate layer comprises amorphous silicic acid.

SUMMARY OF THE INVENTION

It is an object of the instant invention to provide a printing plate suitable for waterless planographic printing in which an ink-repellent crosslinked silicone elastomer layer is bonded to the photosensitive layer via an adhesive layer.

It is a further object of the invention to provide an adhesive layer that does not contain any physiologically or environmentally hazardous constituents.

It is yet another object of the invention to provide an adhesive layer that can be applied in a simple way by coating from aqueous solutions.

It is another object of the invention to provide an adhesive layer that results in an especially strong adhesion between the ink-repellent layer and the photosensitive layer.

In accordance with these and other objects, there is disclosed a presensitized printing plate for waterless planographic printing, comprising a layer support; a radiation-sensitive layer, an outer, ink-repellent, crosslinked silicone elastomer layer; and an intermediate layer by which the adhesion between the silicone elastomer layer and the radiation-sensitive layer is improved. The intermediate layer consists of amorphous silicic acid. The process of making this presensitized plate is disclosed.

In accordance with this invention, there is also proposed a process for preparing a printing form for waterless planographic printing. In the process a presensitized planographic printing plate as described above is imagewise exposed and immersed into developer solution. The photosensitive layer, together with the superimposed silicone rubber layer, is subsequently removed from the non-image areas by rubbing.

DETAILED DESCRIPTION OF THE PREFERRED EMBODIMENTS

The intermediate layers of the printing plates according to this invention are preferably produced by coating a diluted silicic acid sol onto the radiation-sensitive, in particular photosensitive, layer and drying the applied sol. If this adhesive layer is not applied, the adhesion of silicone rubber layers to the majority of photosensitive layers is totally insufficient. It has been found that adhesive layers comprising silanes, for example, aminoalkylsilanes, which are usually applied result in a certain improvement of the adhesion between the photosensitive layer and the silicone layer. However, these silane layers adversely either affect the processing of the printing plate or their anchoring effect is so poor that the imagewise exposed plate cannot be developed to give an acceptable printing stencil.

The silicic acid sols employed for the production of the adhesive layers usually comprise silicic acid particles having sizes between 5 and 150 nm, preferably between 20 and 50 nm. The aqueous silicic acid sols may be stabilized at an alkaline or acid pH value. Preference is given to sols stabilized at an alkaline pH. To achieve improved wetting of the photosensitive layer, it is advantageous to mix the sol with a small amount of a water-soluble surfactant, in particular an anionic or non-ionic surfactant. Suitable substances include, for example, alkali metal salts of long-chain alkanoic acids, alkylsulfonic acids, monoalkylsulfates, alkylbenzenesulfonic acids, and polyalkoxyphenol ethers. Since the surfactants themselves impede strong adhesion, their amount preferably should be kept as low as possible. In general, the preferred amount of surfactant varies between about 1% and 15% by weight, preferably between about 1% and 10% by weight, and in particular between about 1% and 5% by weight, relative to the solids content of the sol.

The anchoring of the silicic acid layer to the photosensitive layer can be further improved by thermally crosslinking substances, such as dimethylol urea or water-soluble melamine resins. These substances are added to the diluted aqueous silicic acid sol, in quantities of 1% to 100% by weight, preferably of 5% to 20% by weight, relative to the quantity of silicic acid.

The silicic acid layer is bonded particularly well to the photosensitive layer if the silicic acid sol is allowed to diffuse slightly into the photosensitive layer. Since the depth of penetration decreases when the photosensitive layer gets dry, the adhesive layer should be applied before the photosensitive layer is more than incipiently dried. The diffusion can also be controlled by adding water-miscible solvents, which cause the photosensitive layer to swell, to the silicic acid sol. The type and amount of the solvent has to be selected such that the photosensitive layer is not dissolved away. The adhesion of the silicic acid layer can also be improved by enlarging the surface area of the photosensitive layer by means of mechanical graining or by adding pigments.

In addition to the required surfactants and, optionally, water-miscible solvents, the silicic acid sols can also contain finely divided fillers. The weight of the silicic acid layer can be varied within wide limits, ranging from about 0.01 to 1.0 $g/m^2$ Preferably it is within the range of about 0.1 to 0.3 $g/m^2$.

The radiation-sensitive layers of the printing plates according to this invention are known per se. They are preferably sensitive to actinic light, especially long-wave UV-light or short-wave visible light, but they may also be sensitive to radiation in the medium or short-wave UV range, to X-ray or corpuscular radiation, and also to longer-wave visible light. They may be negative-working or positive-working, i.e., rendered insoluble or soluble by irradiation. Due to the image reversal taking place in waterless offset printing processes, plates provided with negative-working, photocurable layers print positive images of the originals, and vice versa. The printing plates of this invention preferentially are provided with positive-working layers, i.e., layers which are rendered soluble by exposure, since with this type of layers the adhesion is particularly markedly improved by the silicic acid layers. Printing plates provided with layers containing the acid-cleavable systems mentioned above are described and claimed in the above-mentioned concurrently filed patent application.

Layers based on 1,2-quinonediazides are particularly suitable as layers rendered soluble by exposure. 1,2-Quinonediazides are known and are, for example, described in German Patents No. 938 233 and No. 15 43 721 and in German Offenlegungsschriften No. 23 31 377, No. 24 47 905 and No. 28 28 037. 1,2-Quinonediazides which are preferably employed include the esters or amides of 1,2-naphthoquinone-2-diazide-4-sulfonic acid or 1,2-naphthoquinone-2-diazide-5-sulfonic acid. Among these, special preference is given to the esters, particularly to those of the 5-sulfonic acid. The added amount of 1,2-quinonediazide compounds generally varies between about 3% and 50% by weight, preferably between about 7% and 35% by weight, relative to the weight of the non-volatile layer constituents. Further constituents of the layer above all include water-insoluble binders which are soluble in aqueous-alkaline solutions.

Suitable alkali-soluble or alkali-swellable resins include natural resins, such as shellac and colophony, and synthetic resins, such as copolymers of styrene and maleic acid anhydride, and, in particular, novolaks. Novolak condensation resins, which have been found to be particularly suitable, are the more highly condensed resins having substituted phenols as the formaldehyde condensation partners. The type and amount of the alkali-soluble resins can vary according to the intended use; proportions of total solids between about 30% and 90% by weight, in particular between about 55% and 85% by weight, are preferred. Phenolic resins of the poly(4-vinyl-phenol) type can also be used to advantage instead of the novolaks or in admixture with novolaks. Additionally, other resins may be used which are not alkali-soluble or water-soluble. Advantageously, the proportion of these resins in general does not exceed about 20% of the alkali-soluble resin. Furthermore, the photosensitive layer can contain small amounts of other substances, such as polyglycols, cellulose derivatives, such as ethyl cellulose, surfactants, dyes and fine-particulate pigments, and UV absorbers, if required.

Other suitable positive-working substances include combinations of diazonium salts and phenolic resins or of diazo resins in the form of their precipitation products with phosphotungstic acid.

Suitable negative-working layers include, inter alia, layers of photopolymerizable mixtures, photocrosslinkable polymers, diazonium salt polycondensation products and azido compounds.

Suitable photopolymerizable mixtures contain a polymerizable compound having at least two terminal, ethylenically unsaturated double bonds, a polymeric binder and a photoinitiator which is capable of initiating the free-radical polymerization of the ethylenically unsaturated compound under the action of actinic radiation. Furthermore, the layer can contain stabilizers or inhibitors to prevent dark polymerization of the monomers, hydrogen donors, surfactants, plasticizers, sensitometric regulators, dyes and colored or uncolored pigments.

The photoinitiators are generally employed in an amount of about 0.01% to 10.0% by weight, preferably of about 0.2% to 5.0% by weight, relative to the nonvolatile constituents of the composition.

Photopolymerizable monomers useful for the purpose of this invention are known and are, for example, described in U.S. Pat. Nos. 2,760,863 and 3,060,023. Preferred examples are acrylic and methacrylic acid esters, such as polyethylene glycol dimethacrylate, acrylates and methacrylates of trimethylol ethane, trimethylol propane, pentaerythritol and of polyhydric alicyclic alcohols. The proportion of monomers contained in the layer in general varies between about 10% and 80% by weight, preferably between about 20% and 60% by weight.

Examples of suitable binders are acrylic resins, polyvinyl acetals, polyvinyl esters, maleate resins, polymers of β-methacryloyloxy-ethyl-N-(p-tolyl-sulfonyl)-carbamate and copolymers of these and similar monomers with other monomers, and also styrene/maleic acid anhydride copolymers, copolymers of methylmethacrylate and methacrylic acid and copolymers of methacrylic acid, alkyl methacrylates and methyl methacrylate and/or styrene, acrylonitrile, and the like. In general, the added quantity of binder amounts to about 20% to 90%, preferably 40% to 80%, by weight of the layer constituents.

Condensation products of aromatic diazonium salts which are capable of condensation, such as, for example, diphenylamine-4-diazonium salts, with aldehydes, preferably formaldehydes, can be employed as diazonium salt polycondensation products. It is particularly advantageous to use mixed condensation products which, apart from the diazonium salt units, contain other, nonphotosensitive units derived from compounds capable of condensation, in particular from aromatic amines, phenols, phenolic ethers, aromatic thioethers, aromatic hydrocarbons, aromatic heterocyclic compounds and organic acid amides. These condensation products are described in U.S. Pat. No. 3,867,147. Generally, all diazonium salt polycondensation products described in U.S. Pat. No. 4,186,017 are suitable.

The photosensitive layers based on diazonium salt condensation products may furthermore contain binders, dyes, indicators, pigments, stabilizers, surfactants and other customary additives. Water-insoluble resinous binders are advantageously employed, in particular in combination with the preferred mixed condensation products of diazonium salts. Examples of suitable binders include polyalkylacrylates, polyvinylacetals and reaction products of dicarboxylic acid anhydrides, for example, maleic or phthalic acid anhydride, with OH-group-containing polymers, for example, polyvinyl acetals, polyvinyl alcohols or partially saponified polyvinyl acetates.

Moreover, polyvinyl cinnamates, chalcone derivatives and aromatic azides are suitable as photocrosslinkable compounds. It is also possible to employ negative-working layers based on acid-curable resins in combination with compounds which form an acid on exposure.

The photosensitive layer in general has a weight of about 0.3 to 10 g/m$^2$, layer weights between about 0.8 and 3 g/m$^2$ being preferred in most cases.

The silicone elastomer layer is applied from a solution in a non-polar solvent, for example, aliphatic or aromatic hydrocarbons, in which the constituents of the adhesive and photosensitive layers virtually do not dissolve under the coating conditions.

In principle, every silicone elastomer which is sufficiently ink-repellent to permit offset printing without dampening solution is suitable. Within the scope of this invention "silicone elastomer" is to be understood, in accordance with the definition by Noll, "Chemie und Technologie der Silikone (Chemistry and Technology of Silicones)," Verlag Chemie, 1968, page 332, as a high-molecular weight, substantially linear diorganopolysiloxane, whereas the term "silicone rubber" is used for the crosslinked or vulcanized products. In every case, a silicone elastomer solution is applied to the photosensitive layer, dried and then crosslinked.

Suitable silicone elastomers are single-component and multi-component types such as are described, for example, in German Offenlegungsschriften No. 23 50 211, No. 23 57 871 and No. 23 59 102.

The single-component silicone elastomers are based on polysiloxanes which contain, for example, terminal acetyl, oxime, alkoxy or amino groups or hydrogen atoms. The remainder of the polysiloxane consists essentially of a dimethylpolysiloxane chain. To a relatively small extent, the methyl groups can also be replaced by other alkyl groups, by halogenoalkyl groups or substituted or unsubstituted aryl groups. The terminal functional groups are easily hydrolyzable and harden under the action of moisture within a period from a few minutes to several hours (RTV-1 silicone elastomers).

The multi-component silicone elastomers can be crosslinkable by addition or by condensation. The addition-crosslinkable types contain in general polysiloxanes with alkenyl groups as substituents and those with hydrogen atoms bonded to silicon. They are crosslinked at temperatures above 50° C. in the presence of platinum catalysts. They have the advantage that they crosslink rapidly at an elevated temperature of, for example, about 100° C. On the other hand, the processing period (pot life) of these systems can be relatively short.

The mixtures crosslinkable by condensation contain diorgano-polysiloxanes with reactive end groups, for example OH groups and acetoxy groups. These are crosslinked with reactive silanes or oligosiloxanes such as alkoxy silanes or acetoxy silanes or siloxanes which contain several Si-H groups in their molecules, in the presence of catalysts, for example, organo-tin compounds, such as dialkyl tin diacetate. These combinations also react relatively rapidly and have therefore a limited pot life.

Multi-component silicone elastomers which are crosslinkable by condensation are employed with particular advantage. The preferred crosslinking agents are vinyl-triacetoxy-silane and aminosilanes, for example, aminoethyl-aminopropyl-trimethoxysilane, which ensure the best adhesion to the silicic acid layer and thus to the photosensitive layer. Layers crosslinked with the aid of aminosilanes are more difficult to develop than layers crosslinked with the aid of vinyl-triacetoxysilane. It is also possible to use vinyl-triacetoxy-silane in combination with other crosslinking agents, as long as these do not interfere with the solubilizing reaction of the photosensitive layer. In the absence of alkyl-triacetoxysilanes, sufficient adhesion can also be achieved employing H-containing siloxanes. In this case, the adhesion is markedly improved during the first few days following the printing plate production, and therefore such plates should be stored for several days prior to further processing.

It is believed that the excellent adhesion of silicone rubber layers containing alkenyl- or alkyl-triacetoxysilanes as crosslinking agents is connected with the release of acetic acid during the crosslinking of the polysiloxane. It seems that the reaction between the silicic acid adhesive layer and the components of the silicone rubber layer is favorably influenced by acetic acid. This assumption is supported by the observation that the moderate adhesion of silicone rubber layers which exclusively contain acetoxy-group-free crosslinking agents is noticeably improved if glacial acetic acid is added to the coating solution.

The concentration of the crosslinking agent or of the mixture of crosslinking agents, respectively, usually is about 1% to 40%, preferably about 2% to 15% by weight, of the amount of polysiloxane. The amount of catalyst preferably varies between about 2% and 10% by weight of the amount of polysiloxane.

After application of the silicone elastomer layers, the silicone elastomers are crosslinked by the action of moisture or by themselves at room temperature or at elevated temperatures to give silicone rubbers which are essentially insoluble in organic solvents. The finished silicone rubber layer in general has a weight from about 1 to 20 g/m$^2$, preferably from about 2 to 6 g/m$^2$.

The dehesive silicone rubber layer is believed to be anchored to the silicic acid layer via a chemical reaction. It is supposed that a condensation reaction takes place between the hydroxyl groups present on the surface of the silicic acid particles and the hydroxyl groups of the high molecular-weight, non-crosslinked silicone elastomers. The terms "dehesive" and "abhesive" are used, throughout this specification, as synonyms in the sense explained for "abhesive" in U.S. Pat. No. 3,511,178.

The preferred multi-component silicone elastomers have the advantage that printing plates prepared with them, on printing without dampening solution, show a substantially lower tendency to scumming than those which have been prepared with usual single-component silicone elastomers. The scratch resistance of the surface of the hardened silicone rubber is also increased in the case of the preferred types of compound.

The layer supports used are in most cases metals. The following can be employed for offset printing plates: bright-rolled, mechanically or electrochemically roughened and, if appropriate, anodically oxidized aluminum which, in addition, may also have been pretreated chemically, for example with polyvinylphosphonic acid, silicates, phosphates, hexafluorozirconates or with hydrolyzed tetraethyl orthosilicate. Other suitable metals are steel and chromium. Since, in contrast to conventional planographic printing plates, it is not necessary for the support surface to be hydrophilic, it is also possible with advantage to use copper, brass or other oleophilic metals as the support surface. The support surface may also be provided with a permanent, oleophilic coating, such as an adhesion-promoting layer. Likewise, plastic sheets, such as polyester, polycarbonate, polyimide or cellulose acetate sheets, can also be used, the surface of which may have been roughened or pretreated otherwise, if necessary, for improving the wettability by printing ink. It is also possible to use known printing plate supports of paper, which for the purposes of this invention must not be necessarily water-resistant. Rubber-elastic support materials are also suitable; such supports also allow printing in direct planographic printing process.

In the case of the printing forms prepared from the material according to the invention, the support material serves as the ink-bearing material, in contrast to the otherwise usual printing forms. The silicone rubber layer which remains in place after exposure and development serves as the image background and, in the dry state, has an ink-repellent action. For printing, both conventional oil-based printing inks and special hydrophilic printing inks, such as have been developed for waterless offset printing and reverse offset printing and are commercially available, can here be used. Since most of the usual layer support surfaces, for example grained or anodically oxidized aluminum, are highly hydrophilic, hydrophilic printing inks are used with advantage. Such inks are, for example, described in German Patent No. 31 40 360.

The printing plates according to this invention are produced as follows. First, the printing plate support is coated, as usual, with the photosensitive coating solution. After incipient drying of the layer the surfactant-containing, diluted silicic acid solution is applied. The dried silicic acid layer is coated with the polysiloxane solution which optionally contains a crosslinking agent and a catalyst; this layer is dried and crosslinked by storing for several hours at room temperature (RTV-1 elastomer) or by moderate heating, for example, during 1 minute to 100° C. to 120° C., and subsequent storing in the dark for several hours at room temperature (RTV-2 elastomer).

By exposure through an original and development, a ready-to-print planographic printing form is obtained from the presensitized plate. Mercury lamps, carbon arc lamps, metal halide lamps, xenon lamps, incandescent tubes, laser equipment, electron beams and other known exposure apparatus may be employed for exposure.

During development, the abhesive silicone rubber layer is swollen by the developer solution, and the more readily soluble portions of the radiation-sensitive layer are dissolved therein. By rubbing with a soft material, such as cotton, tissue or sponge rubber, those portions of the swollen silicone rubber layer which lie above the dissolved areas of the photosensitive layer break away, and are removed. Thus, the surface of the printing plate support is bared. The bared surface readily accepts ink, whereas the remaining silicone layer is ink-repellent. Inking of the developed plate can be performed inside or outside the printing press.

Suitable developers on the one hand must be able to cause strong swelling of the abhesive layer and to penetrate it quickly, and also to develop the soluble areas of the photosensitive layer thoroughly. On the other hand, they must not attack the relatively insoluble areas. Known solvent mixtures, for example, mixtures of aliphatic hydrocarbons and alcohols or ketones, are used as developers.

The ink-repellent non-image areas are raised by a few micrometers relative to the ink-receptive support surface laid bare by the development. These differences in height can be compensated for by filling the depressions with printing ink during the roller application of the ink. When the ink has dried, the ink-receptive and the ink-repellent surface areas are on the same level.

Examples of preferred embodiments of the printing plate according to this invention are described below. Parts by weight (p.b.w.) and parts by volume (p.b.v.) bear the same relationship as g and ml. Unless otherwise specified, percentages and quantity ratios relate to weight.

EXAMPLE 1

A filtered solution of
1.8 p.b.w. of the naphthoquinonediazide sulfonic acid ester described below,
0.22 p.b.w. of naphthoquinone-(1,2)-diazide(2)-4-sulfonyl chloride,
0.07 p.b.w. of 2,3,4-trihydroxy-benzophenone,
6.6 p.b.w. of a cresol/formaldehyde novolak having a melting range of 105 to 120° C., acc. to DIN 53,181, and
0.08 p.b.w. of crystal violet, in
91.22 p.b.w. of a mixture of 5 p.b.v. of tetrahydrofuran, 4 p.b.v. of ethylene glycol monomethyl ether and 1 p.b.v. of butyl acetate,
was coated onto an aluminum plate which had been roughened by brushing, and dried.

The naphthoquinonediazide sulfonic acid ester employed was prepared as follows:

A solution of 25.5 p.b.w. of naphthoquinone(1,2)-diazide-(2)-5-sulfonic acid chloride in 442 p.b.w. of acetone was cleared over activated carbon. 26.3 p.b.w. of the cresol/formaldehyde novolak described above and 4.4 p.b.w. of 2,3,4-trihydroxybenzophenone were dissolved in the solution, and the resulting composition was mixed with a solution of 11.9 p.b.w. of $NaHCO_3$ in 124 p.b.w. of water and with 160 p.b.w. of saturated sodium chloride solution. The mixture was stirred for 10 minutes and then allowed to settle; the settled lower phase was discarded, and the acetone solution was poured into a solution of 6 p.b.w. of HCl (30% strength) and 1,500 p.b.w. of water within a few minutes. The precipitated yellow, flaky reaction product was isolated by suction, washed with water and dried. The yield was 48 p.b.w.

The resulting photosensitive material was spin-coated with the following solution:
95.2 p.b.w. of deionized water,
4.8 p.b.w. of a 30% strength anionic silicic acid solution having a Na20 content of about 0.15% and a particle size of 25 to 30 nm, and
0.04 p.b.w. of nonylphenol-polyglycol ether.

The plate of the spinning equipment rotated at a speed of about 175 rpm. The layer was dried with the aid of warm air and then spin-coated with the following solution, at a speed of about 110 rpm:
84 p.b.w. of an aliphatic hydrocarbon mixture, boiling range 116° to 142° C.,
15 p.b.w. of a 33% strength solution of a dihydroxypolydimethyl siloxane in toluene, viscosity at 25° C., 9,000 to 15,000 mPa·s,
0.7 p.b.w of vinyl-triacetoxysilane, and
0.3 p.b.w. of dibutyl-tin diacetate.

The layer was dried and vulcanized by heating it to 110° C. for 4 minutes in a drying cabinet. The dehesive layer had a weight of 3.3 g/m$^2$.

The resulting presensitized printing plate was exposed through a negative film original (48 lines/cm) for 40 s, using a 5 kW metal halide lamp arranged at a distance of 120 cm, then wiped for a few minutes with a soft cotton pad soaked with developer liquid, whereby all three layers were removed from the exposed areas. The developer employed was composed of 4 p.b.v. of isopropanol and 1 p.b.v. of an aliphatic hydrocarbon mixture (boiling range 116° to 142° C.).

In a small offset press, from which the dampening unit had been removed, the printing plate could be easily inked with commercially available waterless offset ink (Waterless Normal Schwarz 175 845, made by Sicpa Druckfarben GmbH). Clean prints were obtained. No damage of the printed image was observed after 10,000 prints.

When the above silicone elastomer solution was directly applied to a positive printing plate of the same type, but without the adhesive layer, the adhesion of the crosslinked silicone rubber layer was insufficient. During development, the dehesive layer was partially removed even from the unexposed areas, so that the image was severely damaged.

EXAMPLES 2 to 11

Example 1 was repeated, with the exception that the crosslinking agents or crosslinking agent mixtures compiled in Table 1 below were used instead of 0.7 g of vinyl-triacetoxysilane:

TABLE 1

| Example No. | vinyl-triacet-oxy-silane (p.b.w.) | p.b.w. | second silane |
|---|---|---|---|
| 2 | 0.40 | — | — |
| 3 | 1.00 | — | — |
| 4 | 0.47 | 0.23 | vinyl-triethoxy-silane |
| 5 | 0.35 | 0.35 | vinyl-triethoxy-silane |
| 6 | 0.23 | 0.47 | vinyl-triethoxy-silane |
| 7 | 0.35 | 0.35 | tetraethoxy-silane |
| 8 | 0.35 | 0.35 | 3-glycidyloxy-propyl-trimethoxy-silane |
| 9 | 0.35 | 0.35 | methylhydrogenosiloxane/ dimethylsiloxane/trimethyl-siloxane (molar ratio 72:24:4) with 1.36% of Si-bonded H (copolymer) |
| 10 | 0.35 | 0.35 | N—aminoethyl-aminopropyl-trimethoxy-silane |
| 11 | — | 0.55 | N—aminoethyl-aminopropyl- |

TABLE 1-continued

| Example No. | vinyl-triacet-oxy-silane (p.b.w.) | p.b.w. | second silane |
|---|---|---|---|
| | | | trimethoxy-silane |

In all cases, good printing plates were obtained, from which clean prints could be produced.

Without the intermediate layer of silicic acid sol according to this invention, the adhesion between the silicone layers of Examples 2 to 11 and the positive layer was unsatisfactory. The printing plate according to Example 11 required a slightly extended developing period.

EXAMPLE 12

A plate was coated with a positive-working photosensitive layer as described in Example 1 and then provided with an adhesive layer by spin-coating it with the following solution:

5.5 p.b.w. of a silicic acid solution having a $SiO_2$ content of 49.5% and a $Na_2O$ content of 0.21% and particle sizes between 21 and 24 nm,
0.04 p.b.w. of nonylphenol-polyglycol ether, and
94.5 p.b.w. of deionized water.

After application of the adhesion-promoting layer, the plate was coated with a silicone elastomer layer as described in Example 1, made ready for printing and used in a printing press. It gave clean prints.

EXAMPLE 13

An electrolytically grained and anodically oxidized aluminum plate was coated with a solution comprised of
1.2 p.b.w. of the esterification product obtained from 1 mole of 2,3,4-trihydroxy-benzophenone and 2 moles of naphthoquinone-(1,2)
diazide-(2)-5-sulfonic acid chloride,
0.7 p.b.w. of the esterification product
obtained from 1 mole of 2,2′-dihydroxy-dinaphthyl-(1,1′)methane and 2 moles of naphthoquinone-((1,2)-diazide-(2)-5 sulfonic acid chloride,
6.5 p.b.w. of the novolak of Example 1, and
0.05 p.b.w. of Sudan Yellow GGN (C.I. 11,021), in a solvent mixture of
40 p.b.w. of 2-methoxy-ethanol,
50 p.b.w. of tetrahydrofuran and
8 p.b.w. of butyl acetate,
and dried. As described in Example 1, the photosensitive layer was then successively coated with an adhesive layer of silicic acid and a silicone elastomer layer. The resulting printing plate was exposed through a negative original, developed with a mixture of 7 parts of isopropanol and 3 parts of an aliphatic hydrocarbon mixture (boiling range 116° to 142° C.) and used for printing in an offset press without a dampening unit. Clean, crisp prints were obtained. No acceptable prints were obtained from a plate which had been prepared in the same way, but without the adhesive layer.

EXAMPLES 14 to 16

The commercially available offset printing plates carrying positive-working layers, which are listed in Table 2 below, were provided with an adhesive layer and a silicone rubber layer as described in Example 13, exposed, developed with a mixture of isopropanol and an aliphatic hydrocarbon mixture (4:1) and used for printing without a dampening unit. All plates produced clean, crisp prints. In the absence of the adhesive layer, it was not possible to produce an acceptable negative dry offset plate from any of the employed positive plates.

TABLE 2

| Example No. | Printing Plate | Manufacturer |
|---|---|---|
| 14 | Spartan ® | Howson-Algraphy |
| 15 | GP II | Polychrome |
| 16 | Endura ® P | 3M |

EXAMPLE 17

An electrochemically grained and anodically oxidized aluminum foil was coated with a solution of
0.88 p.b.w of 4-(α,α-dimethyl-benzyl)phenyl ester of naphthoquinone(1,2)
diazide-(2)-4 sulfonic acid,
0.44 p.b.w. of the esterification product obtained from 1 mole of 2,2′-dihydroxy-dinaphthyl(1,1)-methane and 2 moles of naphthoquinone-(1,2)-diazide-(2)-5-sulfonic acid chloride,
5.90 p.b.w. of the novolak described in
Example 1,
0.20 p.b.w. of naphthoquinone-(1,2)-diazide-(2)-4 sulfonic acid chloride, and
0.06 p.b.w. of crystal violet, in a solvent mixture comprised of
40 p.b.w. of 2-methoxy-ethanol,
40 p.b.w. of tetrahydrofuran, and
8 p.b.w. of butylacetate.

The resulting printing plate was spin-coated, at 175 rpm, with a solution of
4.0 p.b.v. of a silicic acid sol as described in Example 1,
4.0 p.b.v. of a 1% strength solution of nonylphenolpolyglycol ether in water,
15 p.b.v. of isopropanol, and
77 p.b.v. of deionized water.

When this adhesive layer was dry, the plate was coated with a silicone rubber layer, as described in Example 1. The dried offset plate was exposed for 2 minutes through a negative film original, using a 5 kW metal halide lamp, and then developed with the aid of a cotton pad soaked with developer. The developer employed was a 1:1 mixture of isopropanol and an aliphatic hydrocarbon (boiling range 116 to 142° C.).

In a small offset press, good, clean prints were obtained from the plate.

When no adhesive layer of silicic acid was applied, it was not possible to produce a dry offset printing form because the adhesion of the silicone rubber layer was insufficient.

EXAMPLE 18

A solution of
5 p.b.w. of a diazonium salt polycondensation product described below,
0.5 p.b.w. of phosphoric acid (85% strength), and
0.5 p.b.w. of Victoria Pure Blue FGA (C.I. 42,595), in
95 p.b.w. of 2-methoxy-ethanol
was applied to an aluminum plate which had been electrolytically grained, anodically oxidized and pretreated with an aqueous solution of polyvinylphosphonic acid.

The polycondensation product was prepared as follows:
32.4 p.b.w. of 3-methoxy-diphenylamine-4-diazonium sulfate were dissolved in 170 p.b.w. of 85% strength phosphoric acid. 22.8 p.b.w. of 4-methyl-4'-methoxymethyl-diphenyl ether were dropwise added to this solution and condensation was conducted for 2 hours at 40° C. Then 25.8 p.b.w. of 4,4'-bis-methoxymethyl-diphenyl ether were added and condensation was performed for another 27 hours at 40° C. The raw condensate was dissolved in 5,000 p.b.v. of water. The condensate was separated by means of 500 p.b.v. of saturated NaCl solution. The chloride of the condensate was dissolved in 800 p.b.v. of water, an from this solution the methane sulfonate was precipitated by means of 300 p.b.v. of saturated sodium methane sulfonate solution. The precipitate was sucked off and dissolved in water and reprecipitated as mesityeene sulfonate by means of sodium mesitylene sulfonate solution. 59 p.b.w. of condensate were obtained.

The described printing plate was coated with silicic acid and silicone elastomer, as described in Example 1. Thereafter, the plate was exposed under a positive film original for 1 minute, using a 5 kW metal halide lamp arranged at a distance of 120 cm. The nonexposed areas were subsequently dissolved away with the following developer solution:
50 p.b.w. of propylene glycol monomethyl ether,
7.5 p.b.w. of 2-hydroxy-ethyl acetate,
7.5 p.b.w. of 2-acetyloxy-ethyl acetate,
0.5 p.b.w. of 1,3-dioxolan-2-one,
1.0 p.b.w. of ammonium benzoate, and
10 p.b.w. of glycerol, in
23.5 p.b.w. of water.

The resulting printing from was suited for waterless offset printing.

When no silicic acid intermediate layer was applied the adhesion between the silicone rubber layer and the photosensitive layer was markedly reduced.

EXAMPLE 19

The following coating solution was applied to an electrolytically grained and anodically oxidized aluminum plate and dried:
97 p.b.w. of the reaction product obtained from a polyvinylbutyral (molecular weight 70,000; 71% of vinyl butyral units, 2% of vinyl acetate units and 27% of vinyl alcohol units) and propenyl sulfonyl isocyanate (acid number 81),
48 p.b.w. of a diazonium salt polycondensation product obtained from 1 mole of 3-methoxy-diphenylamine-4-diazonium sulfate and 1 mole of 4,4'-bis-methoxymethyl-diphenyl ether, isolated as the mesitylene sulfonate,
4.8 p.b.w. of phosphoric acid (85% strength)
3.5 p.b.w. of Victoria Pure Blue FGA (C.I. Basic Blue 81), and
1.6 p.b.w. of phenylazo-diphenylamine, in
3,500 p.b.w. of 2-methoxy-ethanol and
1,036 p.b.w. of tetrahydrofuran.

The resulting photosensitive layer was coated with a silicic acid adhesive layer and a silicone rubber layer, as described in Example 1. Then the plate was exposed for 40 seconds through a positive original as described in Example 18 and developed with a mixture comprising 70% of an aliphatic hydrocarbon mixture (boiling range 174° to 189° C.) and 30% of propylene glycol monomethyl ether. The properties of the resulting printing form were comparable to those of the printing form of Example 18.

EXAMPLE 20

A commercially available negative-working printing plate based on diazo compounds (Marathon ® AQ2, manufacturer: Howson-Algraphy) was coated with an adhesive layer and a silicone rubber layer as described in Example 1, exposed for 45 seconds as described in Example 18, and developed in a mixture (1:1) of isopropanol and the hydrocarbon mixture of Example 1. The results were substantially the same as in Example 18.

EXAMPLE 21

A commercially available negative-working offset printing plate on a photopolymer basis (WRN, manufactured by Polychrome) was coated with a silicic acid sol solution of the following composition:
4 p.b.v. of the silicic acid sol described in Example 1,
4 p.b.v of a 1% strength aqueous solution of nonylphenol-polyglycol ether,
42 p.b.v. of deionized water, and
50 p.b.v. of isopropanol.

When the adhesive layer was dry, the plate was coated with a silicone rubber layer as described in Example 1. Then a ready-to-print plate for waterless offset printing was prepared by exposure performed for 25 seconds through a positive film original (written and line pattern), using a 5 kW metal halide lamp, followed by wiping with a cotton pad soaked with developer liquid. The developer used was a mixture comprised of
9 p.b.v. of an aliphatic hydrocarbon mixture having a boiling range of 174° to 189° C. and 1 p.b.v. of propylene glycol monomethyl ether.

Good prints were obtained in a small offset press without dampening unit.

Without the silicic acid adhesive layer, it was not possible to produce an acceptable dry offset printing

EXAMPLE 22

A negative offset printing plate on a photopolymer basis of the S-GAN type (manufacturer: Polychrome) was spin-coated with a silicic acid sol having the following composition:
4 p.b.v of the silicic acid sol of Example 1,
4 p.b.v. of a 1% strength aqueous solution of nonylphenol-polyglycol ether,
0.1 p.b.w. of dimethylol urea, and
92 p.b.w. of deionized water.

The further processing was the same as described in Example 1, except that a positive film original was substituted for the negative film original. During the exposure, care was taken to ensure that the film original completely covered the plate surface.

The resulting printing plate was well suited for waterless offset printing.

Without the adhesive layer, no usable dry offset printing plate could be produced.

EXAMPLE 23

A positive printing plate provided with a silicic acid adhesive layer in accordance with Example 1 was spin-coated, at 110 rpm, with a silicone elastomer layer of the following composition:
15 p.b.w. of a 30% strength solution of a vinyl group-containing polysiloxane in toluene, having a viscosity (25° C.) of 15,000 to 30,000 mPa·s,
0.5 p.b.w. of a 5% strength solution of a copolymer of methylhydrogen siloxane, dimethyl siloxane and trimethyl siloxane (72:24:4) containing 1.36% of hydrogen bonded to Si, in gasoline, 0.5 p.b.w. of a catalyst solution having a platinum content of 0.1%, 0.2 p.b.w. of vinyl-triacetoxy-silane, and 84 p.b.w. of an aliphatic hydrocarbon mixture, boiling range 116° to 142° C.

The elastomer was vulcanized by heating it to 110° C. for 4 minutes, so that a silicone rubber layer was obtained. The further processing was carried out in accordance with Example 1. A turbid mixture comprising 90 p.b.v. of water, 9 p.b.v. of isopropanol and 1 p.b.v. of an aliphatic hydrocarbon mixture having a boiling range of 116° to 142° C., which had been saturated with sodium metasilicate, was employed as developer.

The dry offset printing plate obtained in this way produced very good prints.

When no silicic acid intermediate layer was applied, the adhesion of the silicone rubber layer was so poor that no printing plates could be produced.

EXAMPLE 24

Example 1 was repeated, with the exception that the following composition was used instead of the silicone elastomer solution of Example 1:

16.9 p.b.w. of a 75% strength solution in toluene of a filler-containing single-component silicone elastomer of the amine type, having a viscosity, at 25° C., of about 9 Pa·s, 135.0 p.b.w. of an aliphatic hydrocarbon mixture, boiling range 116° to 142° C., and 5.6 p.b.w. of toluene.

Vulcanization was accomplished by exposing the layer for one day to the ambient air (in the dark), and not by heating.

When the printing plate prepared in this way was employed in a small offset press from which the dampening unit had been removed, the ink-repellent silicone rubber layer exhibited good adhesion and durability. Without the silicic acid adhesive layer according to this invention, the silicone rubber layer present in the non-exposed areas was damaged when the exposed areas were dissolved away.

EXAMPLE 25

Example 1 was repeated, with the exception that the following silicone elastomer solution was employed:

11.4 p.b.w. of the dimethyl-polysiloxane solution of Example 1, 9.4 p.b.w. of a 40% strength solution, in toluene, of a filler-containing single-component silicone elastomer of the acetic acid type, having a viscosity, at 25° C., of about 350 mPa·s, 0.53 p.b.w. of vinyl-triacetoxy-silane, 0.22 p.b.w. of dibutyl tin diacetate, and 100 p.b.w. of an aliphatic hydrocarbon mixture having a boiling range of 116° to 142° C.

Good prints were obtained in a printing press. Similarly good results were achieved when the following hydrophilic dispersion was employed as printing ink.

A mixture was prepared from 40 p.b.w. of an aqueous emulsion of an alkali-soluble acrylate polymer having a solids content of 40% by weight, 20 p.b.w. of propylene glycol, 4 p.b.w. of triethanolamine, 4 p.b.w. of a 35% strength methyl silicone oil emulsion, 4 p.b.w. of mineral oil having a boiling range of 190° to 250° C. and 8 p.b.w. of starch ether.

To this mixture, 20 p.b.w. of an aqueous pigment dough having a content of 45% by weight of copper phthalocyanine pigment were added. The composition thus obtained was dispersed into a homogeneous printing ink by means of a three-roll mill.

What is claimed is:

1. A presensitized printing plate for waterless planographic printing comprising
   a support;
   a radiation-sensitive layer on the support comprising a negative-working composition that is rendered insoluble in irradiated areas or a positive-working composition that is rendered soluble in irradiated areas;
   an ink-repellent silicone layer; and
   an amorphous silicic acid layer between the radiation-sensitive layer and the silicone layer.

2. A printing plate as claimed in claim 1, wherein the intermediate layer is produced by applying and drying an aqueous silicic acid sol.

3. A printing plate as claimed in claim 2, wherein the silicic acid sol contains a water-soluble surfactant.

4. A printing plate as claimed in claim 3, wherein the surfactant is present in an amount between about 1 and 15% by weight relative to the solids content of the sol.

5. A printing plate as claimed in claim 3, wherein the surfactant is present in an amount between about 1% and 5% by weight relative to the solids content of the sol.

6. A printing plate as claimed in claim 1, wherein the amorphous silicic acid further comprises a thermally cross-linkable substance.

7. A printing plate as claimed in claim 6, wherein the thermally cross-linkable substance is a member of the group consisting of dimethylol urea and water-soluble melamine resins.

8. A printing plate as claimed in claim 1 further comprising an interface layer between the silicic acid layer and the radiation-sensitive layer, said interface layer containing both silicic acid and radiation-sensitive constituents.

9. A printing plate as claimed in claim 1, wherein the intermediate layer has a weight per unit area of 0.01 g/m$^2$ to 1 g/m$^2$.

10. A printing plate as claimed in claim 1, wherein the silicone layer is a cross-linkable elastomer.

11. A printing plate as claimed in claim 10, wherein the elastomer is a two-component elastomer crosslinkable by condensation reaction at room temperature.

12. A printing plate as claimed in claim 11, wherein the silicone elastomer contains an alkenyltriacetoxysilane as the cross-linking agent.

13. A printing plate as claimed in claim 10, wherein the elastomer is a multi-component elastomer.

14. A printing plate as claimed in claim 1, wherein the silicone layer is a cross-linked silicone rubber having a weight per unit area of 1 g/m$^2$ to 20 g/m$^2$.

15. A printing plate as claimed in claim 1, wherein the radiation-sensitive layer is negative working.

16. A printing plate as claimed in claim 1, wherein the radiation-sensitive layer is positive working and contains a 1,2-quinonediazide as the radiation-sensitive compound.

17. A process for making a presensitized printing plate for waterless planographic printing comprising the steps of:
   providing a support layer;
   coating a radiation-sensitive composition in a solvent;

coating a silicic acid sol on the radiation-sensitive coating; and coating an ink-repellent silicone elastomer on the silicic acid coating.

18. A process as claimed in claim 17, wherein the silicic acid sol is coated before the solvent has completely evaporated from the radiation-sensitive coating.

19. A process as claimed in claim 18, wherein the silicic acid sol further comprises water-miscible solvents.

20. A process as claimed in claim 18, wherein the silicic acid sol further comprises a water-soluble surfactant.

21. A process as claimed in claim 20, wherein the silicic acid sol further comprises a thermally cross-linkable substance selected from the group consisting of dimethylol urea and water-soluble melamine resins.

22. A process of using the presensitized printing plate of claim 1 to make a printing form suitable for waterless planographic printing comprising of the steps of:

imagewise exposing the presensitized plate of claim 1 to radiation;

immersing the exposed printing plate in a solution containing a water-miscible organic solvent;

removing portions of the radiation-sensitive layer and the overlying silicone layer, wherein the portions removed in said positive-working composition are the irradiated areas and the portions removed in said negative-working composition are the nonirradiated areas.

23. A process for preparing a printing form suitable for waterless planographic printing, wherein a presensitized planographic printing plate as claimed in claim 1 is imagewise exposed and then immersed into a developer solution and thereafter the photosensitive layer is removed from the image areas by rubbing, together with the portions of the silicone rubber layer, which are present over these areas.

24. A printing form prepared by the process of claim 23.

* * * * *